(12) United States Patent
Sharma et al.

(10) Patent No.: US 6,891,403 B2
(45) Date of Patent: May 10, 2005

(54) ON-CHIP PLL LOCKED FREQUENCY DETERMINATION METHOD AND SYSTEM

(75) Inventors: Harsh D. Sharma, Austin, TX (US); Howard L. Levy, Cedar Park, TX (US); Hong Kim, Austin, TX (US); Nadeem N. Eleyan, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 106 days.

(21) Appl. No.: 10/277,566

(22) Filed: Oct. 22, 2002

(65) Prior Publication Data

US 2004/0075477 A1 Apr. 22, 2004

(51) Int. Cl.[7] .............................................. G01R 23/02
(52) U.S. Cl. ......................................... 327/47; 327/44
(58) Field of Search ........................ 327/39–49; 331/44, 331/177 R, DIG. 2; 714/30, 31

(56) References Cited

U.S. PATENT DOCUMENTS

| | | | | |
|---|---|---|---|---|
| 4,604,588 A | * | 8/1986 | Webler et al. | ............... 331/135 |
| 5,889,435 A | * | 3/1999 | Smith et al. | ................. 331/1 A |
| 6,384,649 B1 | * | 5/2002 | Boerstler et al. | ........... 327/156 |
| 6,396,889 B1 | * | 5/2002 | Sunter et al. | ............... 375/376 |
| 6,557,117 B1 | * | 4/2003 | Wu et al. | ...................... 714/30 |
| 6,661,266 B1 | * | 12/2003 | Variyam et al. | ............ 327/159 |

* cited by examiner

*Primary Examiner*—Minh Nguyen
(74) *Attorney, Agent, or Firm*—Zagorin O'Brien Graham LLP

(57) ABSTRACT

The locked frequency of a PLL is used to latch a test signal through various latching devices (flip-flops or the like). Various different delays are selectively applied to the test signal to provide a delayed test signal and the delayed test signal is measured to determine whether the delay in the test signal matches the jitter in the locked frequency of the PLL. When the delay in the test signal matches the jitter in the locked frequency of the PLL, the respective delay of the test-signal is used to determine the effective locked frequency of the PLL.

9 Claims, 4 Drawing Sheets

ON-CHIP PLL LOCKED FREQUENCY DETERMINATION METHOD AND SYSTEM

BACKGROUND

1. Field of the Invention

The present application relates to semiconductor integrated circuit design, specifically to Phase Locked Loop (PLL) design in the semiconductor integrated circuit.

2. Description of the Related Art

Generally, PLL circuits are used to provide specific clock frequencies for a circuit. PLL circuits are designed to output specific frequency with a limited amount of jitter, however due to the variations in the designs and manufacturing for example, process, voltage and temperature (PVT), the output of the PLL may exceed the jitter limits and thus the "effective" clock frequency of the PLL may vary from the designed output. When PLL circuit locks at different effective frequency than what it is designed for, functional failures may occur on the chip. When the effective locked frequency of the PLL is unknown, it becomes difficult to debug the integrated circuit. During the production phase, it becomes difficult to determine whether any functional failures are due to the malfunction of other circuits on the chip or the actual PLL output itself.

Further, during manufacturing, integrated circuits are graded according to the operational speed based on the effective clock frequency. The speed of operation of an integrated circuit depends upon the frequency locked by the PLL in the integrated circuit. Thus, it is critical to determine the effective frequency locked by the PLL. Various peripheral measurement devices are used to estimate the effective PLL lock frequency. These external testing methods consume considerable amount of time to thoroughly test each integrated circuit and result in significant production delays. Therefore, an on-chip system and method are needed to determine the effective locked frequency of PLLs.

SUMMARY

The present application describes various embodiments of an on-chip system and method of determining the effective locked frequency of a PLL. In some embodiments, the locked frequency of the PLL is used to latch a test signal through various latching devices (flip-flops or the like). In some variations, different delays are selectively applied to the test signal to provide a delayed test signal. In some embodiments, the delayed test signal is measured to determine whether the delay in the test signal matches the jitter in the locked frequency of the PLL. In some variations, when the delay in the test signal matches the jitter in the locked frequency of the PLL, the respective delay of the test signal is used to determine the effective locked frequency of the PLL. In some embodiments, a control unit provides the test signal. In some variations, the control unit is configured to determine the effective locked frequency of the PLL.

A method of determining locked frequency of a phase locked loop (PLL), is also described. In some embodiments, the method includes matching at least one of a plurality of delay units with a jitter in output of the PLL and identifying the locked frequency of the PLL using the matched delay. In some embodiments, the method includes selecting the at least one of the plurality of delay units, providing an input test signal using the output of the PLL for the selected delay to output a delayed input test signal, waiting for a predetermined period and determining whether the delayed input test signal matches the input test signal. In some variations, the method further includes iteratively repeating the steps of selecting, providing and determining until the delayed input test signal matches the input test signal. In some variations, the predetermined period represents a total path delay between the input test signal and the delayed input test signal.

The present application also describes various embodiments of semiconductor integrated circuit in accordance with the present invention. In some variations, the semiconductor integrated circuit includes a frequency determining unit, the frequency determining unit includes one or more delay elements, one or more input latching devices coupled to the delay elements and configured to latch a test signal, and one or more output latching devices coupled to the delay elements and configured to latch a test signal after the test signal is delayed by the delay elements. In some embodiments, the semiconductor integrated circuit includes a first selector coupled to the delay elements and configured to select the delayed signal for an output. In some variations, the semiconductor integrated circuit includes a second selector coupled to the delay elements, configured to select the one or more input latching devices for the test signal. In some variations, the input latching devices latch the test signal at a first transition of an output of a Phase Locked Loop (PLL) coupled to the input latching devices and the output latching devices latch the delayed test signal at a second transition of the output of the Phase Locked Loop (PLL) coupled to the output latching devices. In some embodiments, a control unit is coupled to the frequency determining unit. In some variations, the control unit is configured to provide the test signal. In some variations, the control unit is configured to receive the delayed test signal and determine a locked frequency of the PLL. In some variations, the control unit is configured to provide select signals for the first and second selector.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
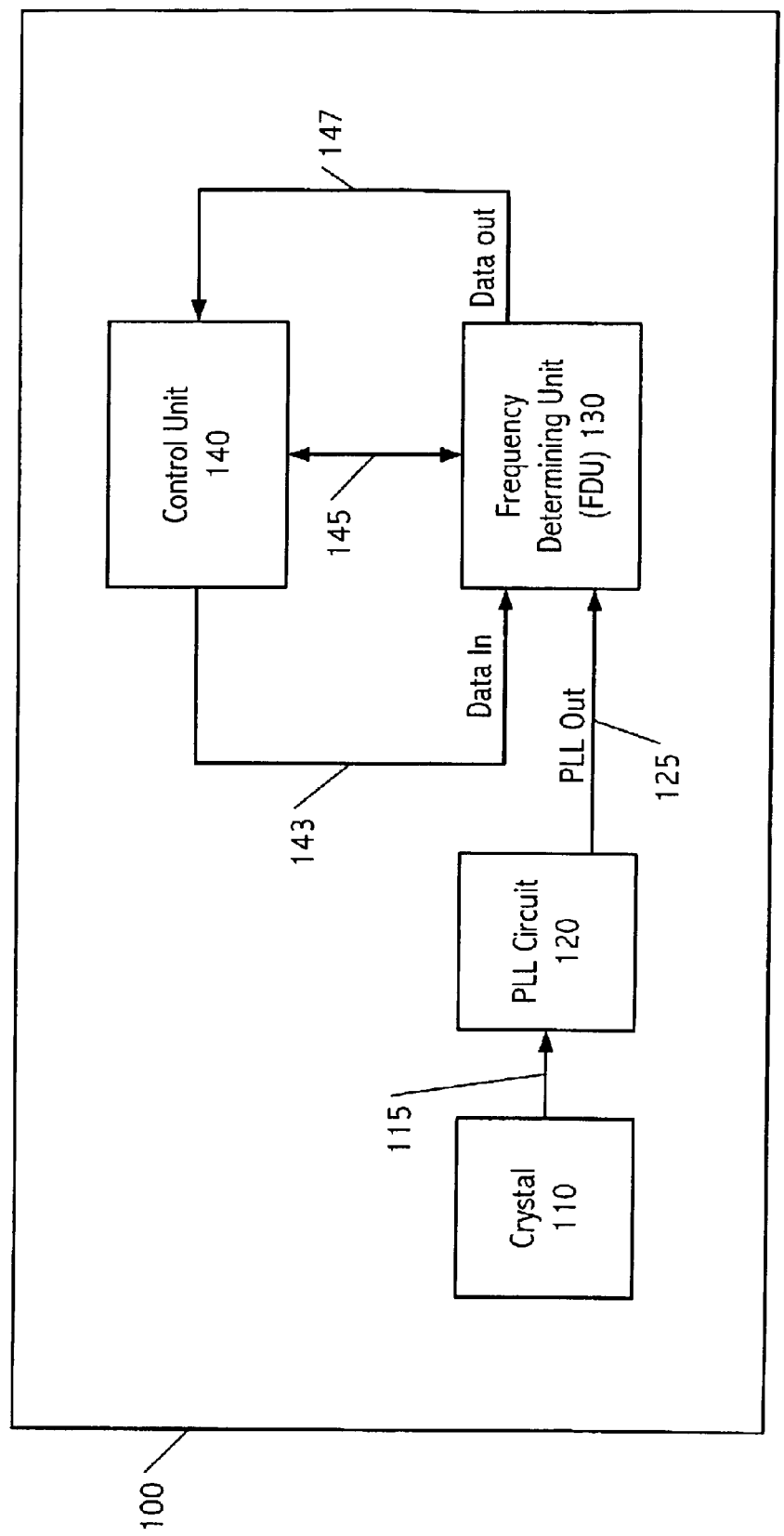
FIG. 1 illustrates a block diagram of an on-chip system for determining the locked frequency of a PLL in an integrated circuit according to an embodiment of the present invention.

FIG. 1 illustrates a block diagram of an on-chip system for determining the locked frequency of a PLL in an integrated circuit 100 according to an embodiment of the present invention. Integrated circuit 100 includes a clock crystal 110. Crystal 110 is coupled to a PLL circuit 120. PLL circuit 120 is configured to lock a frequency according to the functional requirements of integrated circuit 100. One of the outputs of PLL circuit 120 is coupled to a Frequency determining unit (FDU) 130. FDU 130 is configured to determine the effective frequency locked by PLL circuit 120. A control unit 140 is coupled to a data input port of FDU 130. Control unit 140 is configured to provide test data to FDU. Control unit 140 provides control signals to FDU 130 and receives the data output from FDU 130.

While for purposes of illustration, in the present example, related functional blocks are shown, one skilled in the art will appreciate that integrated circuit 100 may include various different additional functional blocks not shown (e.g., arithmetic unit, peripheral units, other processing units, memory, or the like). Further, the links shown here are for illustrative purposes only. Integrated circuit 100 can have various different links (e.g., various different busses, signals or the like) between various different functional units, for example, one link is shown as the output of PLL circuit 120 coupled to FDU 130 however the output of PLL circuit 120 can be coupled to various functional units within integrated circuit 100. Similarly, control unit 140 can be a central processing unit of integrated circuit 100 or one of several processing units in a multiprocessor integrated circuit. Control unit 140 can be configured to report the results of tests on FDU 130 in various ways (e.g., code representing the locked frequency or the like). When the pin density of integrated circuit 100 permits, a separate test pin can be dedicated for peripheral devices to read the locked frequency of PLL circuit 120. One skilled in the art will appreciate that the locked frequency determined by control unit 140 can be represented in various different ways known in the art.

Figure 2A:
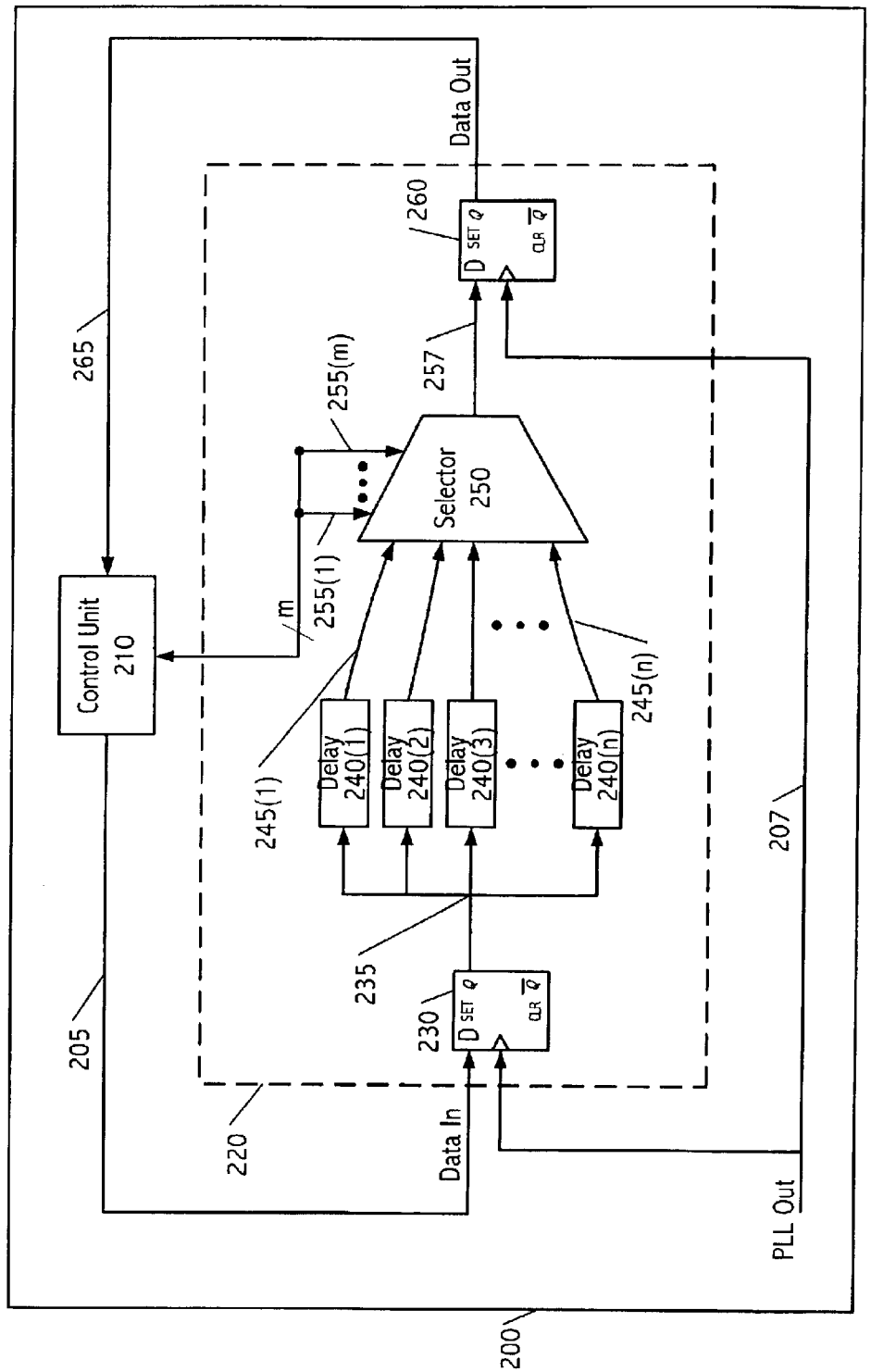
FIG. 2A illustrates functional architecture of a frequency determining unit within an integrated circuit according to an embodiment of the present invention.

FIG. 2A illustrates functional architecture of a frequency determining unit within an integrated circuit 200 according to an embodiment of the present invention. Integrated circuit 200 includes a control unit 210 and a frequency determining unit 220 (FDU). Control unit 210 is coupled to FDU 220 at the data input of a flip-flop 230. FDU 220 receives the output of a PLL circuit (not shown) at the clock input of flip-flop 230. The output of flip-flop 230 is split 'n' ways and coupled to 'n' delay units 240(1)-(n). Delay units 240(1)-(n) can be any circuits of a known delay that are insensitive to PVT variations (e.g., inverter chain, fingering transistors, using longer channel widths or the like). Fingering transistors and using 'longer channel widths' are common techniques known in the art. Fingering transistors are large transistors folded into multiple shorter transistors in parallel. The functionality and strength of the multiple transistors in parallel are typically identical to the original large transistors. Generally, the multiple transistors in parallel are less susceptible to PVT variations. Using longer channel transistors also makes circuits more resilient to PVT variations.

Each one of the delay units is coupled via respective links 245(1)-(n) to a selector 250. Selector 250 is configured to select one of 'n' inputs (e.g., 245(1)-(n)) based on the select controls received on a control bus 255(1)-(m) from control unit 210 and couple the selected input to an output link 257. Flip-flop 260 is coupled to selector 250. Flip-flop 260 receives the output of the PLL circuit at the clock input. The output of flip-flop 260 is coupled to control unit 210.

Initially, when a PLL locks a clock frequency, the clock is used to latch data in flip-flop 230. Control unit 210 provides test data (e.g., static input, variable input or the like) to flip-flop 230. The test data is latched into flip-flop 230 at every transition of the PLL out. Each one of delay units 240(1)-(n) provides different delay for the output of flip-flip 230. The value of each one of the delays can be determined based on the simulation of the clock jitter of the PLL circuit.

The number and value of the delay units can be configured according to the required accuracy of measurements. For example, if the PLL out is configured to be 1 GHz and clock jitter can be within the range of 100 nanoseconds then 10 delay units can be placed to provide delay in steps of 10 nanoseconds. Similarly, if further definite measurement is required then 100 delay units, each with 1 nanosecond delay, can be configured. The number and the value of the delay units can be determined based on several factors for example, the desired accuracy of the measurement, cost of delay units compared to the overall cost of the integrated circuit, design area available within the integrated circuit, complexity of routing and placement of other critical paths within the integrated circuits or the like.

The outputs of delay units 240(1)-(n) are input to selector 250. Selector 250 selectively couples one of the outputs of delay units 240(1)-(n) to flip-flop 260 based on the select controls received by control unit 210. The output of selector 250 is latched into flip-flop 260 using PLL out clock. Control unit 210 receives the output of flip-flop 260 and performs delay analysis. For purposes of illustrations, in the present example, if delay unit 240(1) provides no additional delay then the test data provided by control unit 210 can typically be received back by control unit 210 after certain known device delays (e.g., latch delay, path delay, setup delay or the like) because the same clock (PLL out) is used to latch data in flip-flops 230 and 260. If the test data is not received within expected delay, the control unit 210 can selectively search (e.g., incrementally increasing delay, using binary search for speedy determination or the like) for a best delay from delay units 240(1)-(n) that matches the jitter of PLL out and determine the effective locked frequency of the PLL.

In the present example, the FDU shown in FIG. 2A is configured on-chip; however, one skilled in the art will appreciate that the FDU can be configured to be used independently as a peripheral unit of integrated circuit 200. The FDU can be used to determine the frequency of any periodically recurring signal such as a clock or the like. The control unit can be configured (e.g., programmed or the like) to provide test data and determine the locked frequency of the PLL upon power-up during the self test or can be configured to perform the test upon request (e.g., during diagnostic, or part of a routine scheduled test or the like). Further, an interface (e.g., a pin or the like) can be provided on chip for external controller (e.g., computer, test instruments, external control blocks or the like) to determine the locked frequency of the PLL for example, an input interface can be provided for external devices to provide the test data and an output interface can be provided for the external devices to read the output of the FDU. Similarly, various configurations or combination thereof can be used to determine the locked frequency of the PLL using the FDU.

It is to be understood that the architectures and implementations depicted herein are merely exemplary, and that in fact, other architectures and implementations can be employed to achieve the same or similar functionality. For example, in some embodiments of the present invention, each one of the delay units can be coupled to individual input and output flip-flops and an input selector can be used to select input flip-flops for the test signal and an output selector can be used to select the output of one of the output flip-flops. Each one of the input and output flip-flops can latch the signals on the transitions of the PLL output. For example, each one of the selected input flip-flops can latch the test signal at a first transition of the PLL output and each one of the output flip-flops can latch the delayed test signal at the second transition of the PLL output. Similarly, the positions of the selectors can be swapped with input and output flip-flops. One skilled in the art will appreciate that various combinations can be configured using the concepts described herein to determine the effective locked frequency of the PLL.

In an abstract, but still definite sense, any arrangement of components to achieve the same functionality is effectively "coupled" such that the desired functionality is achieved. Hence, any two components herein combined to achieve a particular functionality can be seen as "coupled with" each other such that the desired functionality is achieved, irrespective of architectures or intermedial components. Likewise, any two components so associated can also be viewed as being "operably connected", or "operably coupled", to each other to achieve the desired functionality.

Figure 2B:
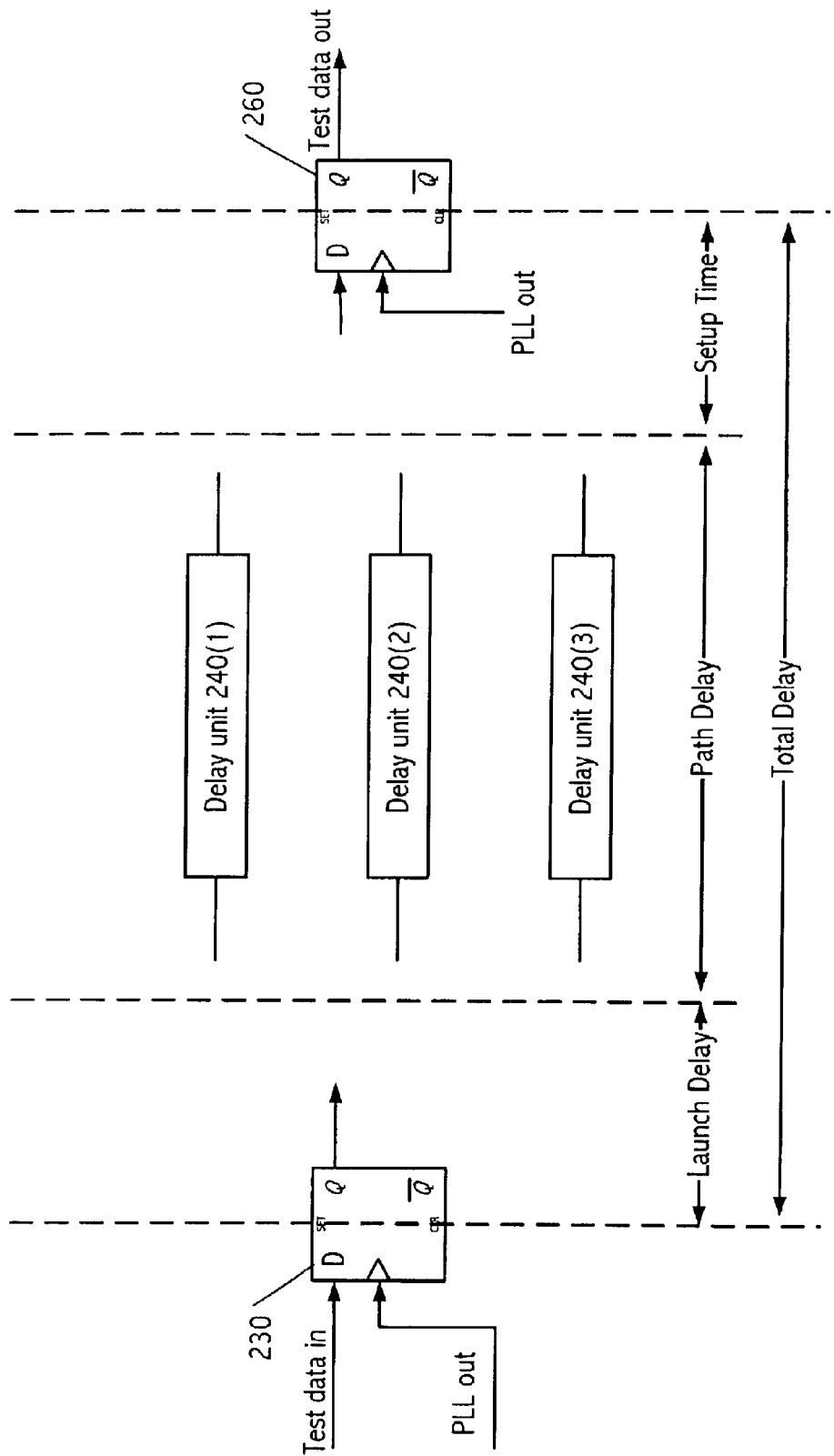
FIG. 2B illustrates an example of determining effective locked frequency of a PLL circuit using frequency determining unit according to an embodiment of the present invention.

FIG. 2B illustrates an example of determining effective locked frequency of a PLL circuit using frequency determining unit 220 according to an embodiment of the present invention. For purposes of illustration, a portion of frequency determining unit 220 is shown however, one skilled in art will appreciate that the frequency determining unit 220 can include other functional elements such as similar to shown and described in FIG. 2A. Further, in the present example, Flip-flop 230 is coupled to three delay unit 240 (1)–(3). However, one skilled in art will appreciate that flip-flop 230 can be coupled to various numbers of delay units appropriate for a particular implementation.

When flip-flop 230 receives the test data (e.g., from control unit 210 or the like), the test data can be available for each one of the delay units after a launch delay of flip-flop 230. Each one of the delay units is configured to provide specific path delay for the test data. After the path delay, the test data becomes available at the input of flip-flop 260. Flip-flop 260 provides an additional delay of setup time. The setup time may include the time required for data to latch in the flip-flop 260 and any other delay (e.g., delay of selector 250 between the delay units and flip-flop 260 or the like). The total delay after which the test data is available at the output of flip-flop 260 is the sum of launch delay, path delay and setup time.

For purposes of illustrations, in the present example, delay unit 240(1) is configured to provide a path delay of 869 picoseconds ('ps'), delay unit 240(2) provides a path delay of 960 ps and delay unit 240(3) provides a path delay of 1070 ps. Each one of the launch delay and setup time is configured to be 20 ps. Table 1 illustrates an example of the total delay for test data through various delay units.

TABLE 1

An example of total delay for the test data.

| Delay Unit | Total delay = (launch delay + Path delay + Setup time) ps | Output Frequency (1/Total delay) |
| --- | --- | --- |
| 240(1) | 20 + 869 + 20 = 909 | 1/909 ps = 1.1 GHz |
| 240(2) | 20 + 960 + 20 = 1000 | 1/1000 ps = 1 GHz |
| 240(3) | 20 + 1070 + 20 = 1110 | 1/1110 ps = 900 MHz |

After providing the test data (e.g., by control unit 210 or the like) at the input of flip-flop 230, each delay unit can be selected (e.g., using selector 250 or the like) to monitor the output of flip-flop 260 to determine whether the data is received as inputted. If the data at the output of flip-flop 260 is available through delay unit 240(1) then the effective locked frequency of the PLL circuit is 1.1 GHz. Similarly, delay unit 240(2) illustrates the effective locked frequency as 1 GHz and delay unit 240(3) illustrates an effective locked frequency of 900 MHz. In the present example, the path delays are configured to provide measurement in the increments of 0.1 GHz. however one skilled in the art will appreciate that the path delays can be configured to provide desired measurement increments. Similarly, while one FDU is shown and described in the integrated circuit, more than one FDU can be used on-chip depending upon the complexity of the integrated circuit (e.g., integrated circuits with multiple frequency domains or the like).

During manufacturing of an integrated circuit, an on chip FDU can be used to grade the integrated circuit according to the frequency performance of the integrated circuit. For example, during manufacturing, due to the PVT variations, each batch of the integrated circuit can have different locked frequency of the PLL. During manufacturing testing, on-chip FDU can be used (e.g., by internal control unit, external devices or the like) to determine the effective locked frequency of the PLL (effective functional frequency of the integrated circuit). Using the example illustrated in FIG. 2B, integrated circuits can be graded according to the effective locked frequencies (e.g., 0.9, 1.0, 1.1 GHz or the like). The variations in the locked frequencies can be different for each manufacturing batch depending upon PVT variations. Thus, the integrated circuits can be graded according to the effective locked frequencies of the PLL.

Figure 3:
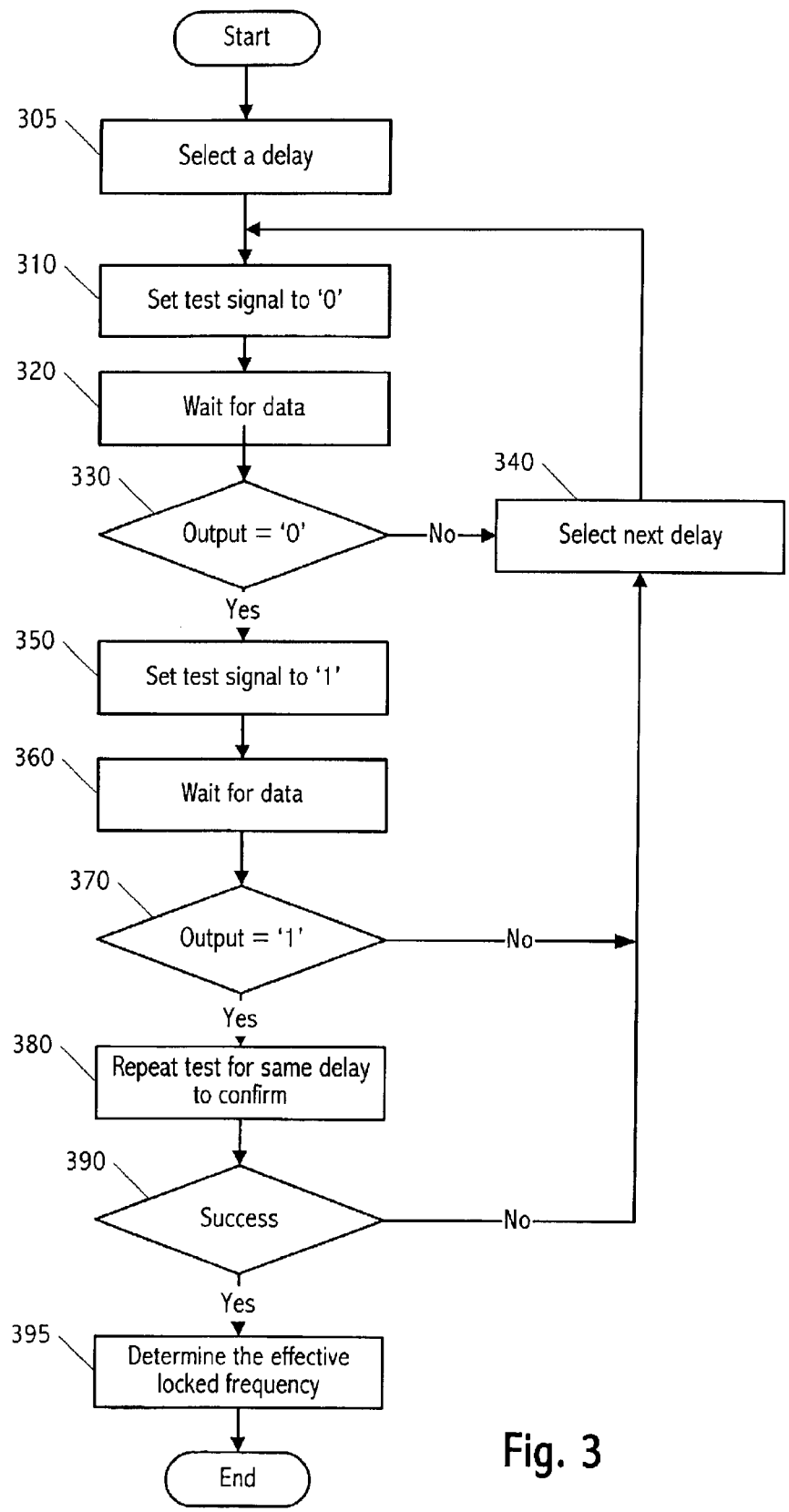
FIG. 3 is a flow diagram illustrating an exemplary sequence of operations performed during a process of determining the locked frequency of a PLL circuit according to an embodiment of the present invention.

FIG. 3 is a flow diagram illustrating an exemplary sequence of operations performed during a process of determining the locked frequency of a PLL circuit according to an embodiment of the present invention. While the operations are described in a particular order, the operations described herein can be performed in other sequential orders (or in parallel) as long as dependencies between operations allow. In general, a particular sequence of operations is a matter of design choice and a variety of sequences can be appreciated by persons of skill in art based on the description herein.

Initially, the process selects a delay (e.g., the longest delay path or the like) for the test signal (e.g., using a selector or the like) (305). For purposes of illustrations, in the present example, a '0-1' test signal is used however one skilled in the art will appreciate that any test signal can be used to determine the effective locked frequency of a PLL circuit using the frequency determining unit. For a '0-1' test, an input of zero (e.g., low signal or the like) is applied at the input of frequency determining unit and after the output is read, a one (e.g., high signal or the like) is applied for similar test. One skilled in the art will appreciate that the test can be performed using any sequence of signals.

The process sets the test signal to zero (e.g., using a control unit or the like) at the input of the frequency determining unit (310). The test signal can be set to zero before the transition of the PLL signal. The process waits before reading the test signal at the output (320). The wait period allows the test signal to be latched at the output of the frequency determining unit. Typically, when a configuration such as the one shown in FIG. 2A is used, the test signal is available at the output after two PLL cycles. The process determines whether the output is zero (i.e., the test signal is received) (330). If the output is not zero, the process determines that the selected delay does not reflect the jitter in the PLL clock. The process selects the next delay (340). The process proceeds to provide test signal for the next delay (310). If the output is zero (i.e., the test signal is received), the process transitions the test signal to one (350). The process waits before reading the test signal at the output (360). The process determines whether the output is one (i.e., the test signal is received) (370). If the output is not one, the process determines that the selected delay does not reflect the jitter in the PLL clock. The process selects the next delay (340). The process proceeds to provide test signal for the next delay (310).

If the output is one (i.e., the test signal is received), the process repeats the test for one or more times using the selected delay (380). The test can be repeated to confirm the output reading. The process determines whether the repeated test for the same delay were successful (390). If the repeated tests were not successful, the process proceeds to select the next delay (340). If the repeated tests were successful, the process uses the selected delay to determine the effective locked frequency of the PLL clock.

The above description is intended to describe at least one embodiment of the invention. The above description is not intended to define or limit the scope of the invention. Rather, the scope of the invention is defined in the claims below. Thus, other embodiments of the invention include other variations, modifications, additions, and/or improvements to the above description. The operations discussed herein may consist of steps carried out by system users, hardware modules and/or software modules. The operations can for example, be directly or indirectly representative of software modules resident on a computer readable medium and/or resident within a computer system and/or transmitted to the computer system as part of a computer program product.

While particular embodiments of the present invention have been shown and described, it will be clear to those skilled in the art that, based upon the teachings herein, various modifications, alternative constructions, and equivalents may be used without departing from the invention claimed herein. Consequently, the appended claims encompass within their scope all such changes, modifications, etc. as are within the spirit and scope of the invention. Furthermore, it is to be understood that the invention is solely defined by the appended claims. The above description is not intended to present an exhaustive list of embodiments of the invention. Unless expressly stated otherwise, each example presented herein is a nonlimiting or nonexclusive example, whether or not the terms nonlimiting, nonexclusive or similar terms are contemporaneously expressed with each example. Although an attempt has been made to outline some exemplary embodiments and exemplary variations thereto, other embodiments and/or variations are within the scope of the invention as defined in the claims below.

What is claimed is:

1. A semiconductor integrated circuit comprising at least one frequency determining unit, the frequency determining unit comprising:

a plurality of delay elements;

one or more input latching devices coupled to receive a test signal and a clock signal, the one or more input latching devices configured to latch the test signal and provide the latched test signal to the plurality of delay elements; and one or more output latching devices coupled to the delay elements to receive the clock signal and a delayed version of the latched test signal after the test signal is delayed by the delay elements, the one or more output latching devices to latch the delayed version of the latched test signal to produce an output signal.

2. The semiconductor integrated circuit of claim 1, further comprising:

a first selector having a plurality of inputs coupled to respective delay elements; and an output to provide the delayed version of the latched test signal to the one or more output latching devices.

3. The semiconductor integrated circuit of claim 1, further comprising:

a second selector coupled to the delay elements, configured to select the one or more input latching devices for the test signal.

4. The semiconductor integrated circuit of claim 1, wherein the one or more input latching devices latch the test signal at a first transition of the clock signal; and the one or more output latching devices latch the delayed version of the latched test signal at a second transition of the clock signal.

5. The semiconductor integrated circuit of claim 4, further comprising:

a control unit coupled to the frequency determining unit, configured to provide the test signal.

6. The semiconductor integrated circuit of claim 5, wherein the control unit is further configured to receive the output signal; and determine a locked frequency of the PLL.

7. The semiconductor integrated circuit of claim 5, wherein the control unit is further configured to provide select signals for a first selector and a second selector.

8. A system for determining locked frequency of a phase locked loop (PLL), in an integrated circuit, comprising:

means for selecting at least one of a plurality of delay units;

means for providing an input test signal using the output of the PLL for the selected delay unit to output a delayed input test signal; and means for determining whether the delayed input test signal matches the input test signal.

9. The system of claim 8, further comprising:

means for iteratively repeating the steps of selecting, providing and determining until the delayed input test signal matches the input test signal.

* * * * *